United States Patent
Ushijima (10) Patent No.: US 10,128,196 B2
(45) Date of Patent: Nov. 13, 2018

(54) SEMICONDUCTOR DEVICE

(71) Applicant: Toyota Jidosha Kabushiki Kaisha, Toyota-shi, Aichi-ken (JP)

(72) Inventor: Takashi Ushijima, Nagoya (JP)

(73) Assignee: Toyota Jidosha Kabushiki Kaisha, Toyota-shi (JP)

(*) Notice: Subject to any disclaimer, the term of this patent is extended or adjusted under 35 U.S.C. 154(b) by 137 days.

(21) Appl. No.: 15/248,701

(22) Filed: Aug. 26, 2016

(65) Prior Publication Data

US 2017/0062340 A1    Mar. 2, 2017

(30) Foreign Application Priority Data

Aug. 31, 2015   (JP) ................................. 2015-171390

(51) Int. Cl.
| | |
|---|---|
| *H01L 23/535* | (2006.01) |
| *H01L 23/528* | (2006.01) |
| *H01L 23/00* | (2006.01) |
| *H01L 23/522* | (2006.01) |
| *H01L 23/051* | (2006.01) |
| *H01L 23/433* | (2006.01) |

(Continued)

(52) U.S. Cl.
CPC .......... *H01L 23/562* (2013.01); *H01L 23/051* (2013.01); *H01L 23/4334* (2013.01); *H01L 24/02* (2013.01); *H01L 29/41741* (2013.01); *H01L 29/456* (2013.01); *H01L 2924/3512* (2013.01); *H01L 2924/35121* (2013.01)

(58) Field of Classification Search
CPC ............................................ H01L 2924/35121
See application file for complete search history.

(56) References Cited

U.S. PATENT DOCUMENTS

| | | | | |
|---|---|---|---|---|
| 6,194,781 | B1 * | 2/2001 | Ikegami | ................ H01L 21/563 |
| | | | | 257/737 |
| 6,406,989 | B1 * | 6/2002 | Ikegami | ................ H01L 21/563 |
| | | | | 257/E21.503 |

(Continued)

FOREIGN PATENT DOCUMENTS

| | | |
|---|---|---|
| JP | H0794549 A | 4/1995 |
| JP | 2005-019829 A | 1/2005 |

(Continued)

*Primary Examiner* — Michael Lebentritt
*Assistant Examiner* — Jordan Klein
(74) *Attorney, Agent, or Firm* — Dinsmore & Shohl LLP (57) ABSTRACT

A semiconductor device including: a semiconductor substrate a semiconductor element is formed; a first electrode layer stacked on the semiconductor substrate and connected to the semiconductor element; a first insulation film stacked on an upper face of the first electrode layer; and a second electrode layer stacked over the first electrode layer and the first insulation film, the second electrode layer including a material having a mechanical strength that is higher than a mechanical strength of a material included in the first electrode layer; wherein a groove portion is provided from the upper face in a direction toward a lower face of the first electrode layer, a protrusion portion protruding into the groove portion is provided on a lower face of the second electrode layer, and a lower end of the protrusion portion is positioned below the center position in a thickness direction of the first electrode layer.

9 Claims, 10 Drawing Sheets

(51) Int. Cl.
*H01L 29/417* (2006.01)
*H01L 29/45* (2006.01)

(56) References Cited

U.S. PATENT DOCUMENTS

| | | | |
|---|---|---|---|
| 2004/0009638 A1* | 1/2004 | Tanaka | H01L 23/4824 |
| | | | 438/202 |
| 2010/0230811 A1* | 9/2010 | Shin | H01L 24/05 |
| | | | 257/737 |
| 2015/0014848 A1* | 1/2015 | Lin | H01L 24/81 |
| | | | 257/737 |
| 2015/0061114 A1 | 3/2015 | Narita | |
| 2016/0218073 A1* | 7/2016 | Yoshioka | H01L 21/7682 |
| 2016/0365486 A1* | 12/2016 | Kim | H01L 33/382 |

FOREIGN PATENT DOCUMENTS

| | | |
|---|---|---|
| JP | 2005-286042 A | 10/2005 |
| JP | 2015-050347 A | 3/2015 |

* cited by examiner

SEMICONDUCTOR DEVICE

CROSS-REFERENCE TO RELATED APPLICATIONS

This application claims priority to Japanese Patent Application No. 2015-171390 filed on Aug. 31, 2015, which is incorporated herein by reference in its entirety including the specification, drawings and abstract.

BACKGROUND

1. Field of the Disclosure

The present disclosure relates to a semiconductor device.

2. Description of Related Art

Japanese Patent Application Publication No. 2015-050347 describes a semiconductor device. The semiconductor device includes a semiconductor substrate with a semiconductor element formed therein, a first electrode layer provided on the semiconductor substrate and electrically connected to the semiconductor element, a protective insulation film stacked on a part of an upper face of the first electrode layer, and a second electrode layer stacked over the first electrode layer and the protective insulation film.

Upon the semiconductor device operating and thereby generating heat, the respective components thermally expand, and as a result of interaction thereof, stress is generated in the respective components. Regarding this point, in the semiconductor device, the protective insulation film and the second electrode layer are both in contact with the upper face of the first electrode layer. Such configuration may cause a difference in stress distribution between an area of the first electrode layer the protective insulation film is in contact with and an area of the first electrode layer the second electrode layer is contact with. Thus, large stress may be generated locally at a boundary between these two areas of the first electrode layer, and thus, for example, when the semiconductor device is subjected to an intense heat history over a long period of time, a crack may be generated in the first electrode layer with the boundary as a starting point. If a crack is generated in the first electrode layer and grows large, for example, the problem of decrease in performance of the semiconductor device may occur.

SUMMARY

The present disclosure provides a semiconductor device that can suppress growth of a crack generated in a first electrode layer.

A semiconductor device according to an aspect of the present disclosure includes: a semiconductor substrate which a semiconductor element is formed; a first electrode layer stacked on the semiconductor substrate and electrically connected to the semiconductor element; a first insulation film stacked on a part of an upper face of the first electrode layer; and a second electrode layer stacked over both the first electrode layer and the first insulation film. Here, a material included in the second electrode layer has a mechanical strength that is higher than a mechanical strength of a material included in the first electrode layer. A groove portion is provided from the upper face in a direction toward a lower face of the first electrode layer, and a protrusion portion protruding into the groove portion is provided on a lower face of the second electrode layer. A lower end of the protrusion portion is positioned below the center position in a thickness direction of the first electrode layer.

In the above semiconductor device, the groove portion is provided in the upper face of the first electrode layer, and the protrusion portion protruding into the groove portion is provided in the lower face of the second electrode layer. Consequently, the first electrode layer is at least partially divided by the protrusion portion of the second electrode layer. A material included in the protrusion portion of the second electrode layer has a mechanical strength that is higher than a mechanical strength of a material included in the first electrode layer. Therefore, even if a crack is generated in the first electrode layer, growth of the crack is physically prevented by the protrusion portion of the second electrode layer. Although the crack generated in the first electrode layer can grow in various forms, it is found that the crack is likely to grow along the center position in the thickness direction of the first electrode layer. Therefore, such crack growth can be suppressed by positioning the lower end of the protrusion portion below the center position in the thickness direction of the first electrode layer.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
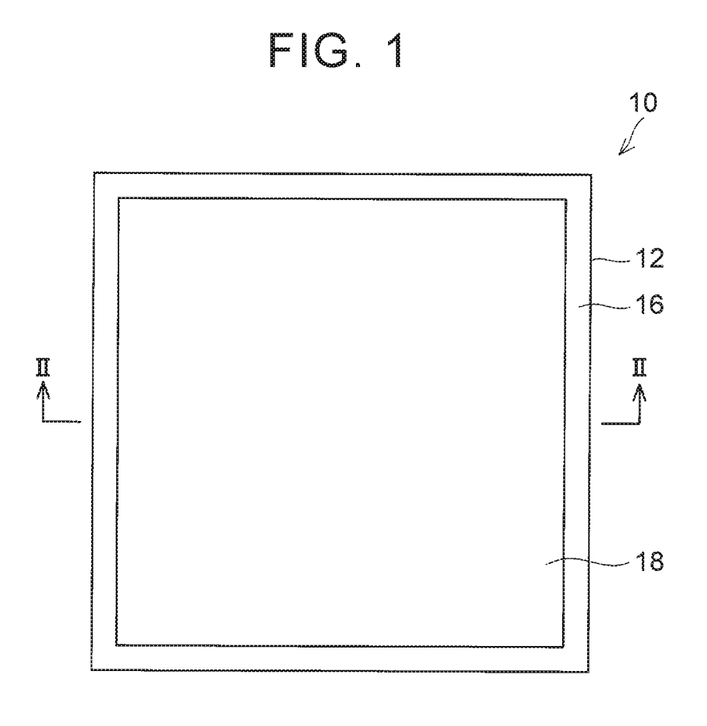
FIG. 1 is a plan view of a semiconductor device 10 according to embodiment 1.
Figure 2:
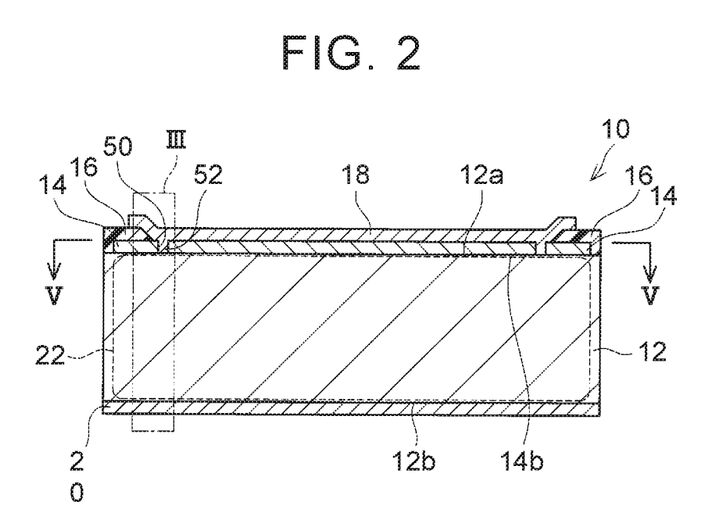
FIG. 2 is a sectional view along II-II in FIG. 1, in which, however, illustration of an inner structure of a semiconductor element 22 formed in a semiconductor substrate 12 is omitted.

A semiconductor device 10 according to an embodiment will be described with reference to the drawings. As illustrated in FIGS. 1 and 2, the semiconductor device 10 includes a semiconductor substrate 12, a first electrode layer 14, a protective insulation film 16, a second electrode layer 18 and a lower face electrode layer 20. The first electrode layer 14, the protective insulation film 16 and the second electrode layer 18 are located on the upper face 12a side of the semiconductor substrate 12, and the lower face electrode layer 20 is located on the lower face 12b side of the semiconductor substrate 12. The upper face 12a and the lower face 12b here are terms used to distinguish two surfaces located on the opposite sides of the semiconductor substrate 12 from each other for the sake of convenience. In other words, the upper face 12a and the lower face 12b here do not necessarily mean an upper face and a lower face in a vertical direction in use of the semiconductor device 10.

The semiconductor substrate 12 is a substrate including a semiconductor material, and can be formed using, for example, silicon (Si) or silicon carbide (SiC). In the semiconductor substrate 12, a semiconductor element 22 is formed. The semiconductor element 22 is not limited to any particular type of semiconductor element, but may be a power semiconductor element, for example, an IGBT (insulated gate bipolar transistor), a MOSFET (metal-oxide-semiconductor field-effect transistor) or a diode. As an example, the semiconductor element 22 according to the present embodiment is an IGBT.

Figure 3:
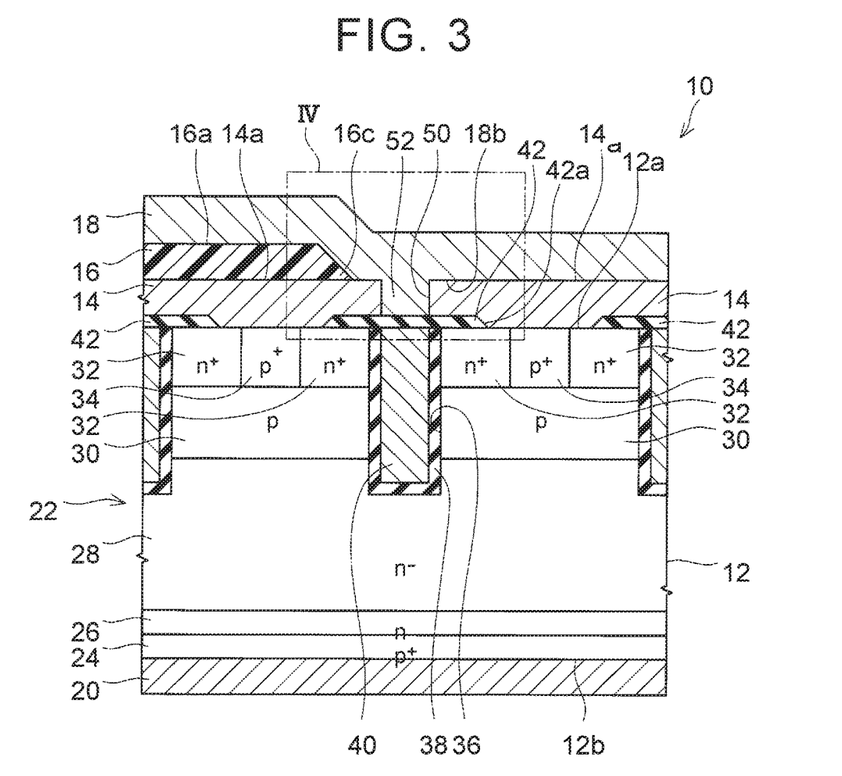
FIG. 3 is an enlarged view of part III in FIG. 2.

The structure of the semiconductor element 22 (IGBT) in the present embodiment will be described with reference to FIG. 3. As illustrated in FIG. 3, the semiconductor element 22 includes a collector region 24, a buffer region 26, a drift region 28, a body region 30, emitter regions 32 and contact regions 34 in this order from the lower face 12b side to the upper face 12a side of the semiconductor substrate 12. Also, the semiconductor element 22 includes a plurality of gate electrodes 40.

The collector region 24 is a p-type region. The collector region 24 is formed in an area of the semiconductor substrate 12, the area being exposed at the lower face 12b. The collector region 24 has a sufficiently-high impurity concentration and is electrically connected to the lower face electrode layer 20. The buffer region 26 is an n-type region. The buffer region 26, which is formed on the upper face side of the collector region 24, is positioned between the collector region 24 and the drift region 28.

The drift region 28 is an n-type region. The drift region 28 has an impurity concentration that is lower than that of the buffer region 26. The drift region 28, which is formed on the upper face side of the buffer region 26, is formed between the buffer region 26 and the body region 30. The body region 30 is a p-type region. The body region 30 has an impurity concentration that is lower than that of the collector region 24. The body region 30, which is formed on the upper face side of the drift region 28, is positioned between the drift region 28, and the emitter regions 32 and the contact regions 34.

The emitter regions 32 are n-type regions. The emitter regions 32 have an impurity concentration that is higher than that of the drift region 28. The emitter regions 32, which are formed on the upper face side of the body region 30, are formed in respective areas of the semiconductor substrate 12, the areas being exposed at the upper face 12a. The emitter regions 32 are electrically connected to the first electrode layer 14. The contact regions 34 are p-type regions. The contact regions 34 have an impurity concentration that is higher than that of the body region 30. The contact regions 34, which are formed on the upper face side of the body region 30, are formed in respective areas of the semiconductor substrate 12, the areas being exposed at the upper face 12a. The contact regions 34 are electrically connected to the first electrode layer 14. At the upper face 12a of the semiconductor substrate 12, the emitter regions 32 and the contact regions 34 are exposed in a fixed arrangement.

The gate electrodes 40 are positioned in respective trenches 36 provided in the semiconductor substrate 12. Each gate electrode 40 includes a conductive material, and can be formed using, for example, polysilicon (poly-Si). The trenches 36 are provided in the upper face 12a of the semiconductor substrate 12, and respective lower ends of the trenches 36 extend to the drift region 28. The trenches 36 extend in parallel with one another along a direction perpendicular to the sheet of FIG. 3. A gate insulating film 38 are provided between each gate electrode 40 and an inner face of the corresponding trench 36. Each gate insulating film 38 includes an insulating material, and can be formed using, for example, silicon dioxide ($SiO_2$). Each gate electrode 40 faces the drift region 28, the body region 30 and relevant emitter regions 32 via the relevant gate insulating film 38. An interlayer insulating film 42 is provided on the upper face 12a of the semiconductor substrate 12 so as to cover the gate electrodes 40. In the interlayer insulating film 42, a plurality of contact holes 42a that cause the upper face 12a of the semiconductor substrate 12 to be exposed are provided. The emitter regions 32 and the contact regions 34 are connected to the first electrode layer 14 via the contact holes 42a. The above structure enables the semiconductor element (IGBT) 22 in the present embodiment to function as a normally-off type power transistor. Here, the configuration of the semiconductor element 22 can arbitrarily be changed and is not limited to the above-described configuration.

Next, an electrode structure on the upper face 12a side of the semiconductor substrate 12 will be described with reference to FIGS. 1 to 4. As described above, on the upper face 12a side of the semiconductor substrate 12, the first electrode layer 14, the protective insulation film 16 and the second electrode layer 18 are provided.

The first electrode layer 14 includes a conductive material. The first electrode layer 14 is provided on the semiconductor substrate 12, and is electrically connected to the semiconductor elements 22 via the contact holes 42a. The first electrode layer 14 can be formed using a metal material, and examples of the metal material include, e.g., aluminum (Al) or an alloy containing aluminum as a main component. As an example, for the first electrode layer 14 in the present embodiment, an Al—Si-based aluminum alloy containing a relatively large amount of silicon (Si). The first electrode layer 14 is electrically insulated from the gate electrodes 40 by the interlayer insulating film 42.

The protective insulation film 16 includes an insulating material, and can be formed using, for example, a resin material. As an example, for the protective insulation film 16 in the present embodiment, polyimide is used. As illustrated in FIGS. 1 and 2, the protective insulation film 16 is provided in a frame-like shape along peripheral edges of the semiconductor substrate 12 in a plan view of the semiconductor substrate 12. At least a part of the protective insulation film 16 is stacked on a part of an upper face 14a of the first electrode layer 14. The protective insulation film 16 has, for example, a function that maintains a pressure resistance of the semiconductor device 10 and a function that protects the semiconductor device 10 from being in contact with foreign substances. A material included in the protective insulation film 16 has a linear expansion coefficient that is higher than those of the respective materials included in the first electrode layer 14, the second electrode layer 18 and the semiconductor substrate 12.

Figure 4:
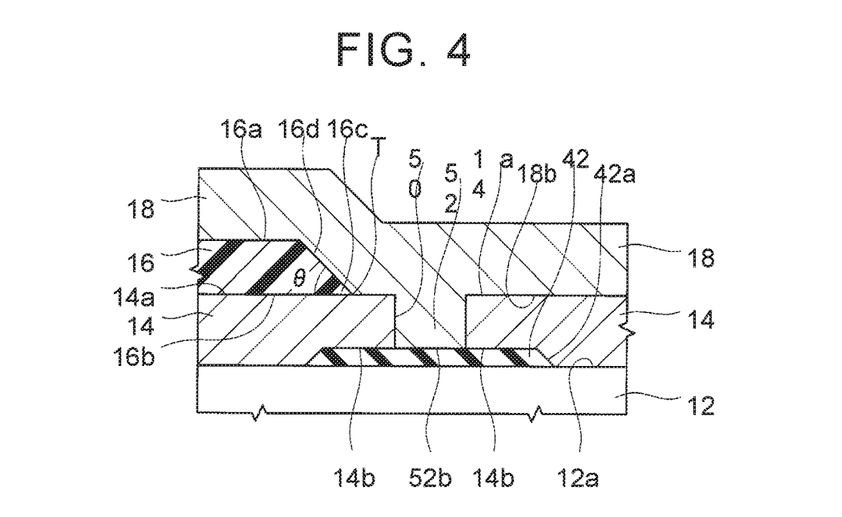
FIG. 4 is an enlarged view of part IV in FIG. 3.

As illustrated in FIGS. 3 and 4, an end portion 16c of the protective insulation film 16 positioned between the first electrode layer 14 and the second electrode layer 18 has a tapered shape. In other words, an angle θ formed by a lower face 16b and the end face 16d of the protective insulation film 16 is an acute angle. The angle θ in the present embodiment is 35 to 40 degrees, and the shape of the end portion 16c of the protective insulation film 16 can be changed to any of various shapes. The angle θ at the end portion 16c of the protective insulation film 16 is not specifically limited, and may be, for example, an angle close to 0 degrees (in particular where the end face 16d is curved concavely) or may be 90 degrees.

The second electrode layer 18 includes a conductive material. The second electrode layer 18 is stacked over the upper face 14a of the first electrode layer 14 and a surface (an upper face 16a and the end face 16d) of the protective insulation film 16. The second electrode layer 18 may be formed using a metal material, and examples of the metal material includes, e.g., nickel (Ni) or an alloy containing nickel as a main component. As an example, for the second electrode layer 18 in the present embodiment, nickel is used. Here, the linear expansion coefficient of the material included in the second electrode layer 18 is closer to the linear expansion coefficient of the material included in the semiconductor substrate 12 than the linear expansion coefficient of the material included in the first electrode layer 14. Between the first electrode layer 14 and the second electrode layer 18, a layer including titanium (Ti) or another conductive material may additionally be provided. In this case, the additional layer can be regarded as a part of the second electrode layer 18.

In the semiconductor device 10 in the present embodiment, the combination of the material included in the first electrode layer 14 and the material included in the second electrode layer 18 may be changed to any of various combinations. However, for the material included in the second electrode layer 18 a material having a mechanical strength that is higher than that of the material included in the first electrode layer 14 may be employed. "Mechanical strength" here means a resistance of a material to destruction, that is, a destruction resistance to an external force, for example, a tensile force or a shear force. The mechanical strength can be determined by various types of indexes: in the present embodiment, in particular, a focus is put on tensile strength and fatigue strength. In other words, for the material included in the second electrode layer 18, a material having a tensile strength that is higher than that of the material included in the first electrode layer 14 may be employed, and in some embodiments, a material having good tensile strength and good fatigue strength may be employed.

In the upper face 14a of the first electrode layer 14, a groove portion 50 is provided, and on the lower face 18b of the second electrode layer 18, a protrusion portion 52 protruding into the groove portion 50 is provided. The protrusion portion 52 includes a material that is the same as that of the second electrode layer 18 and is formed integrally with the second electrode layer 18. As illustrated in FIG. 4, the groove portion 50 in the present embodiment extends to a lower face 14b of the first electrode layer 14, and, the protrusion portion 52 of the second electrode layer 18 is connected to the upper face 12a of the semiconductor substrate 12 with the first electrode layer 14 not interposed therebetween. At the position illustrated in FIG. 4, a lower end 52b of the protrusion portion 52 is in contact with the interlayer insulating film 42, but at another position (for example, a position where the groove portion 50 extends in a direction intersecting with a longitudinal direction of the trenches 36), the lower end 52b of the protrusion portion 52 can be in direct contact with the upper face 12a of the semiconductor substrate 12. Also, as will be described in detail later, the groove portion 50 of the first electrode layer 14 may be a bottomed groove and the lower end 52b of the protrusion portion 52 may be positioned in the first electrode layer 14.

Figure 5:
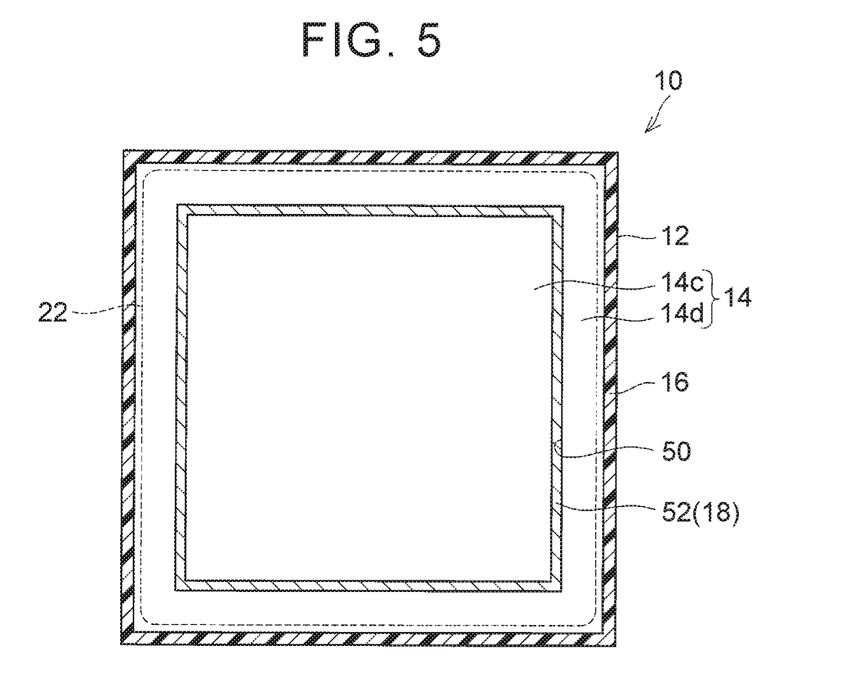
FIG. 5 is a sectional view along V-V in FIG. 2.

As illustrated in FIGS. 4 and 5, the groove portion 50 extends in a looped shape in the upper face 14a of the first electrode layer 14. Consequently, the first electrode layer 14 are divided in an inner part 14c positioned inside the looped groove portion 50 and an outer part 14d positioned outside the looped groove portion 50. The protective insulation film 16 is in contact with the outer part 14d of the first electrode layer 14 and not in contact with the inner part 14c of the first electrode layer 14. Also, the entire inner part 14c of the first electrode layer 14 is positioned on an element region of the semiconductor substrate 12. The element region of the semiconductor substrate 12 here refers to a region of the semiconductor substrate 12 in which the semiconductor element 22 is formed. Here, a part of the outer part 14d is also positioned on the element region of the semiconductor substrate 12.

Figure 6:
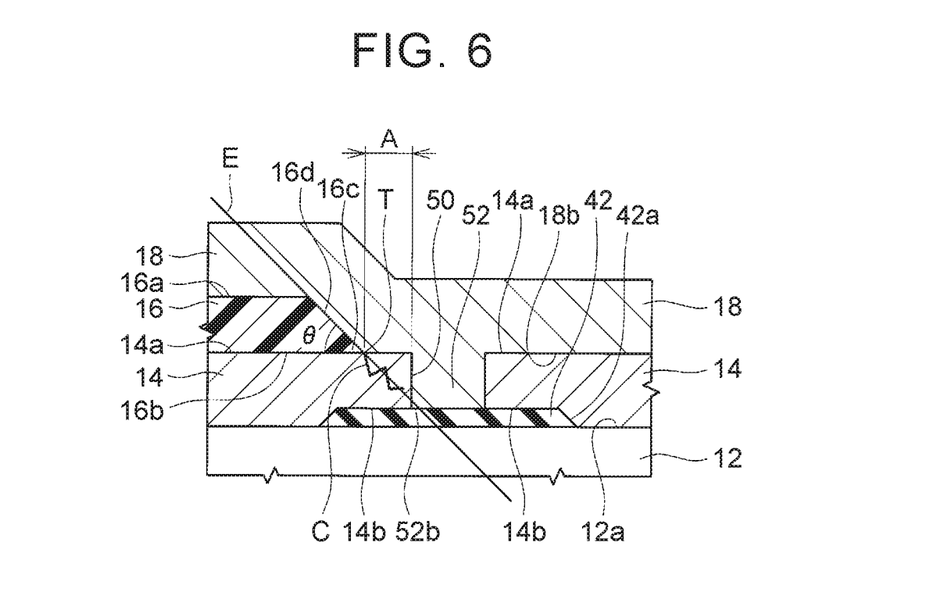
FIG. 6 is a diagram illustrating a positional relationship between a protective insulation film 16 and a groove portion 50 of a first electrode layer 14.

Upon the semiconductor device 10 configured as described above operating and thereby generating heat, the respective components thermally expand. The respective components include mutually-different materials and thus have mutually-different linear expansion coefficients. Therefore, the respective materials thermally expand in different ways, and as a result of an interaction thereof, stress is generated in the respective components. Regarding this point, in the semiconductor device 10 according to the present embodiment, the protective insulation film 16 and the second electrode layer 18 are both in contact with the upper face 14a of the first electrode layer 14. The material included in the protective insulation film 16 has a linear expansion coefficient that is larger than that of the material included in the second electrode layer 18. Also, the lower face 14b of the first electrode layer 14 is connected to the upper face 12a of the semiconductor substrate 12. Such configuration may cause a difference in distribution of stress generated in the first electrode layer 14 between an area of the first electrode layer 14 the protective insulation film 16 is in contact with and an area of the first electrode layer 14 the second electrode layer 18 is in contact with. Thus, as illustrated in FIG. 6, large stress may be generated locally at a boundary T between two areas of the first electrode layer 14. Therefore, for example, when the semiconductor device 10 is subjected to an intense heat history over a long period of time, a crack C may be generated in the first electrode layer 14 with the boundary T as a starting point. If a crack C is generated in the first electrode layer 14 and grows large, for example, the problem of decrease in performance of the semiconductor device 10 may occur.

In order to solve the above problem, in the semiconductor device 10 according to the present embodiment, the groove portion 50 is provided in the upper face 14a of the first electrode layer 14, and the protrusion portion 52 protruding into the groove portion 50 is provided on the lower face 18b of the second electrode layer 18. Here, the material included in the second electrode layer 18 has a mechanical strength that is higher than that of the material included in the first electrode layer 14. With such configuration, the first electrode layer 14 is at least partially divided by the protrusion portion 52 of the second electrode layer 18 having a high mechanical strength. Consequently, even if a crack C is generated in the first electrode layer 14, growth of the crack C is physically suppressed by the protrusion portion 52 of the second electrode layer 18. Therefore, even if a crack C is generated in the first electrode layer 14, the crack C can be avoided from growing large.

A position in the first electrode layer 14 where the groove portion 50 is formed (that is, a position in the second electrode layer 18 where the protrusion portion 52 is formed) is not specifically limited. The groove portion 50 and the protrusion portion 52 can be disposed in various manners according to an estimated growth path of a crack C. The growth path of a crack C can be estimated by a test or a simulation taking the specific structure of the semiconductor device 10 into consideration. However, as illustrated in FIG. 6, in order to early stop growth of a crack C, a distance A from the starting point of the crack C (that is, the boundary T) to the groove portion 50 is designed to be small. As an example, the distance A can be determined according to the thickness of the first electrode layer 14, and for example, may be less than ten times, less than five times, or less than the thickness of the first electrode layer 14.

The distance A may also be determined according to a sectional shape of the protective insulation film 16. A past study shows that the direction of growth of a crack C can vary according to a sectional shape of the protective insulation film 16. In particular, the protective insulation film 16 in the present embodiment includes the end portion 16c having a tapered shape, and the lower face 16b and the end face 16d form an acute angle. In such configuration, the direction of growth of a crack C can vary according to the angle θ at the end portion 16c of the protective insulation film 16. More specifically, it is found that a crack C is likely to grow along an extension plane E, which is an extension of the end face 16d of the protective insulation film 16. Therefore, the groove portion 50 and the protrusion portion 52 intersect with the extension plane E of the end face 16d of the protective insulation film 16, and the distance A and a sectional shape of the groove portion 50 can be determined so as to provide such positional relationship.

Figure 7:
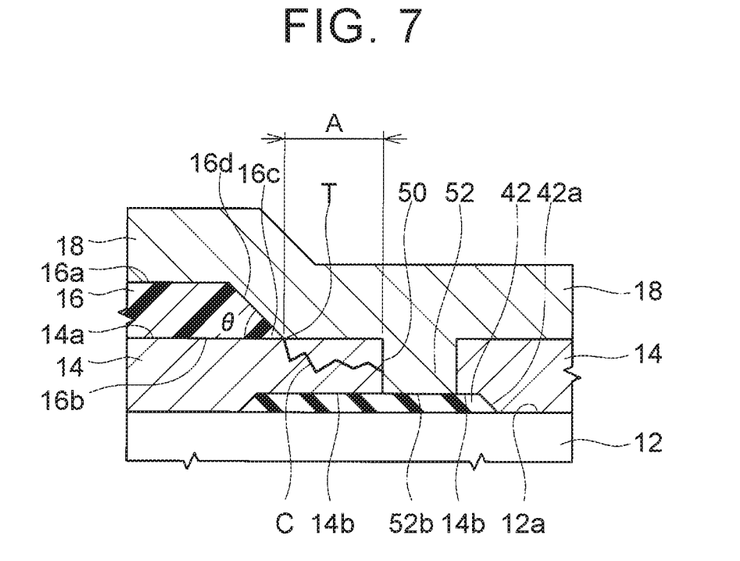
FIG. 7 illustrates an alteration of the semiconductor device 10 in which a position of a groove portion 50 of a first electrode layer 14 relative to a protective insulation film 16 is changed.

Also, as illustrated in FIG. 7, the distance A can be designed so as to have a relatively large value. Although a crack C can grow in various directions, as an aspect, it is found that a crack C is likely to grow along the center position in the thickness direction of the first electrode layer 14. This is because if shear stress is generated in the first electrode layer 14, the shear stress can be largest at the center position in the thickness direction. If the crack C grows along the center position in the thickness direction of the first electrode layer 14, the first electrode layer 14 may finally be divided into two in the thickness direction. Such growth of the crack C can be suppressed also by designing the distance A to be relatively large, enabling the first electrode layer 14 to be avoided from being divided into two in the thickness direction.

In the semiconductor device 10 according to the present embodiment, as described above, the groove portion 50 of the first electrode layer 14 extends in a looped shape in the upper face 14a of the first electrode layer 14. Consequently, the first electrode layer 14 is divided in the inner part 50c positioned inside the looped groove portion 50 and the outer part 50d positioned outside the looped groove portion 50 (see FIG. 5). As is clear from the above description, a crack C can be generated with the boundary T among the first electrode layer 14, the protective insulation film 16 and the second electrode layer 18 as a starting point (see FIG. 6). Regarding this point, the inner part 14c of the first electrode layer 14 is not in contact with the protective insulation film 16. Therefore, a crack C can be generated not in the inner part 14c but in the outer part 14d of the first electrode layer 14. Then, the inner part 14c of the first electrode layer 14 is separated from the outer part 14d of the first electrode layer 14 by the groove portion 50 and the protrusion portion 52 of the second electrode layer 18. Therefore, even if a crack C is generated in the outer part 14d of the first electrode layer 14, the crack C is prevented from growing up to the inner part 14c of the first electrode layer 14. Then, the inner part 14c of the first electrode layer 14 is positioned on the element region of the semiconductor substrate 12. Therefore, even if a crack C is generated in the outer part 14d of the first electrode layer 14, the inner part 14c of the first electrode layer 14 is not affected by the crack C, enables maintenance of the functions of the semiconductor device 10.

From the aforementioned viewpoints, the inner part 14c of the first electrode layer 14 is designed to occupy a large area in the entire area of the first electrode layer 14. Consequently, even if a crack C is generated in the first electrode layer 14, higher performance of the semiconductor device 10 can be maintained. As an example, the inner part 14c of the first electrode layer 14 may be no less than 50 percent, no less than 75 percent, or no less than 90 percent of the entire area of the first electrode layer 14.

In the semiconductor device 10 according to the present embodiment, as described above, the groove portion 50 provided in the upper face 14a of the first electrode layer 14 extends to the upper face 14a of the first electrode layer 14 (see FIG. 4). Such configuration enables a crack generated in the first electrode layer 14 to be more reliably prevented from growing beyond the groove portion 50 of the first electrode layer 14 (that is, the protrusion portion 52 of the second electrode layer 18). Also, where the groove portion 50 extends to the lower face 14b of the first electrode layer 14, the lower end 52b of the protrusion portion 52 of the second electrode layer 18 is connected to the upper face 12a of the semiconductor substrate 12 with the first electrode layer 14 not interposed therebetween. Such configuration can suppress deformation and displacement of the semiconductor substrate 12 and the second electrode layer 18 relative to each other and thus can reduce stress acting on the first electrode layer 14 positioned between the semiconductor substrate 12 and the second electrode layer 18. Consequently, generation and growth of a crack C in the first electrode layer 14 can be suppressed.

In the semiconductor device 10 according to the present embodiment, as described above, the linear expansion coefficient of the material included in the second electrode layer 18 is closer to the linear expansion coefficient of the material included in the semiconductor substrate 12 than the linear expansion coefficient of the material included in the first electrode layer 14. Such configuration can, for example, when the semiconductor device 10 generates heat, reduce a difference between thermal expansion of the second electrode layer 18 positioned on the upper face 14a side of the first electrode layer 14 and thermal expansion of the semiconductor substrate 12 positioned on the lower face 14b side of the first electrode layer 14. As a result, stress (in particular, shear stress) generated in the first electrode layer 14 is reduced, enabling suppression of generation and growth of a crack C in the first electrode layer 14.

Figure 8:
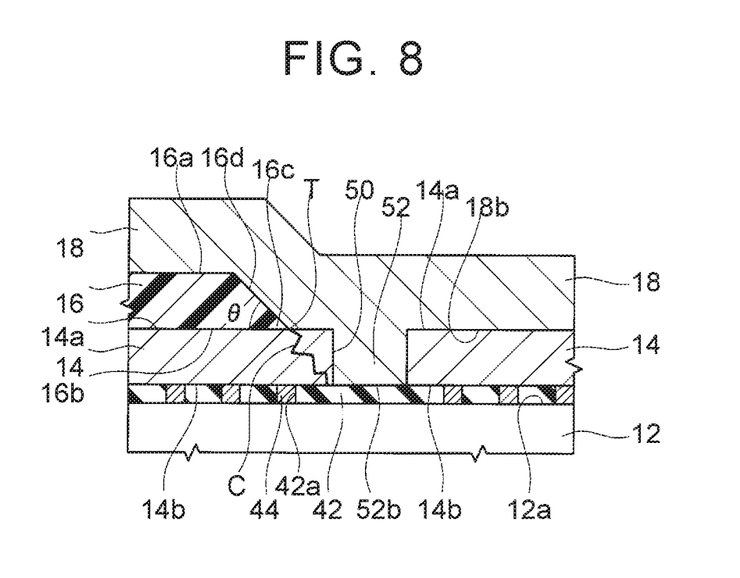
FIG. 8 illustrates an alteration of the semiconductor device 10 in which embedded electrodes 44 are provided in contact holes 42a of an interlayer insulating film 42.
Figure 9:
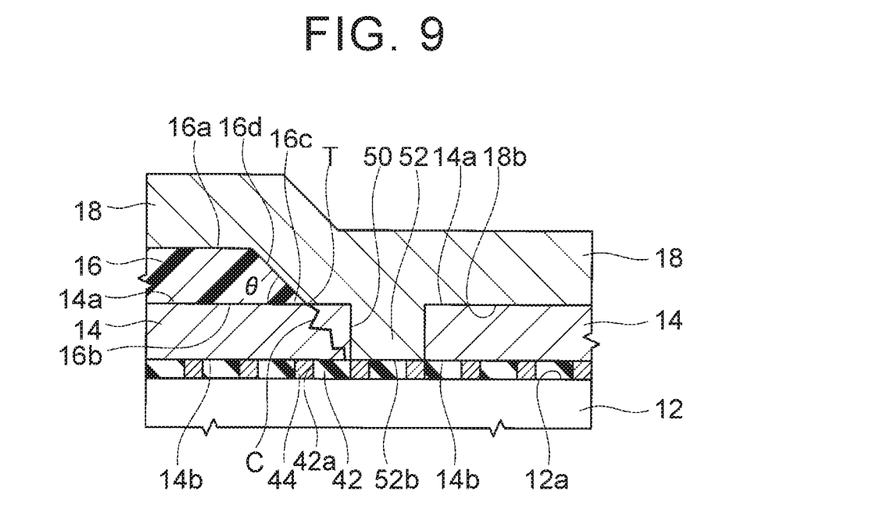
FIG. 9 illustrates an alteration of the semiconductor device 10 in which embedded electrodes 44 are provided in contact holes 42a of an interlayer insulating film 42, and in particular, illustrates electric connection of a lower end 52b of a protrusion portion 52 of a second electrode layer 18 to an upper face 12a of a semiconductor substrate 12 via an embedded electrode 44.

As illustrated in FIGS. 8 and 9, as an alteration of the semiconductor device 10, embedded electrodes 44 may be provided in the contact holes 42a of an interlayer insulating film 42. The embedded electrodes 44 can include a metal or another conductive material. The configuration of the embedded electrodes 44 is not specifically limited. As an example, the embedded electrodes 44 can be formed by means of chemical vapor deposition, sputtering or plating using one or more of, e.g., tungsten (W), aluminum (Al) and copper (Cu). The configuration illustrated in FIGS. 8 and 9 can avoid direct contact between a semiconductor substrate 12 and a first electrode layer 14. Therefore, even if a crack C is generated in the first electrode layer 14 and the crack C grows up to a lower face 14b of the first electrode layer 14, the crack C can be prevented from running up to the semiconductor substrate 12. Here, an area of the first electrode layer 14 in which a crack C can be generated is limited, and more specifically, is an area between of an end portion 16c of a protective insulation film 16 and a groove portion 50 of the first electrode layer 14 in a plan view of the first electrode layer 14. Therefore, in order to prevent a crack C from running up to the semiconductor substrate 12, a structure that prevents at least the area from being in direct contact with the semiconductor substrate 12 may be provided.

Figure 10:
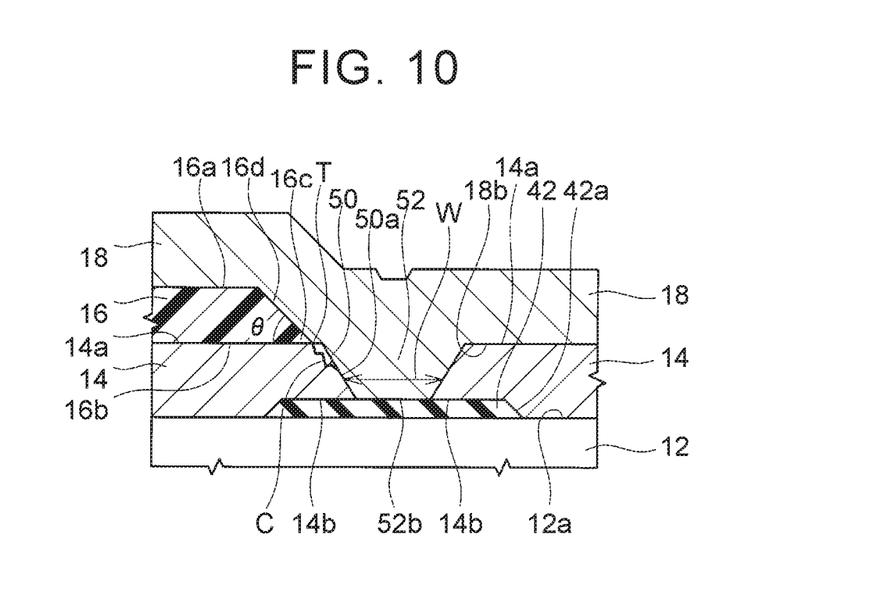
FIG. 10 illustrates an alteration of the semiconductor device 10 in which a width W of a groove portion 50 of a first electrode layer 14 increases as closer to an upper face 14a of the first electrode layer 14.
Figure 11:
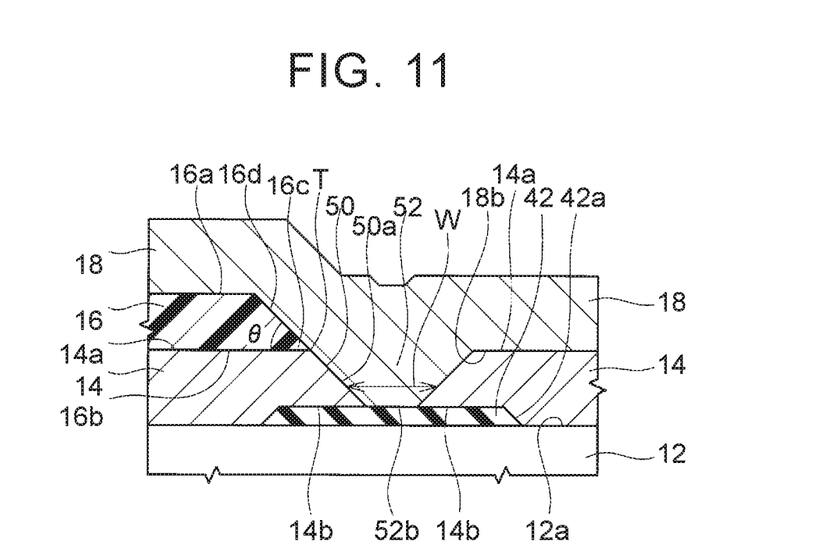
FIG. 11 illustrates an alteration of the semiconductor device 10 in which a side face 50a of a groove portion 50 of a first electrode layer 14 is continuous with an end face 16d of a protective insulation film 16.

As illustrated in FIGS. 10 and 11, as an alteration of the semiconductor device 10, a groove portion 50 of a first electrode layer 14 may have a width W that varies along a depth direction. In this case, the width W of the groove portion 50 is larger the closer to an upper face 14a of the first electrode layer 14. With such configuration, in a process of manufacturing a semiconductor device 10, in stacking of a second electrode layer 18 on a first electrode layer 14 with a groove portion 50 formed therein, the inside of the groove portion 50 can easily be filled by a material of the second electrode layer 18. Here, the stacking of the second electrode layer 18 can be performed by, for example, sputtering. Also, the area of contact between the first electrode layer 14 and the second electrode layer 18 in the groove portion 50 can be increased. Furthermore, a side face 50a of the groove portion 50 is inclined, and thus, if a crack C grows up to the groove portion 50, an angle formed by the crack C and a surface of a protrusion portion 52 of the second electrode layer 18 is relatively small. Consequently, stress acting on the protrusion portion 52 of the second electrode layer 18 at a point the crack C reaches decreases, enabling decrease in the risk of the crack C running up to the protrusion portion 52. Here, as illustrated in FIG. 11, the side face 50a of the groove portion 50 may be provided so as to be continuous from an end face 16d of the protective insulation film 16. Such configuration can suppress generation of a crack C itself.

Figure 12:
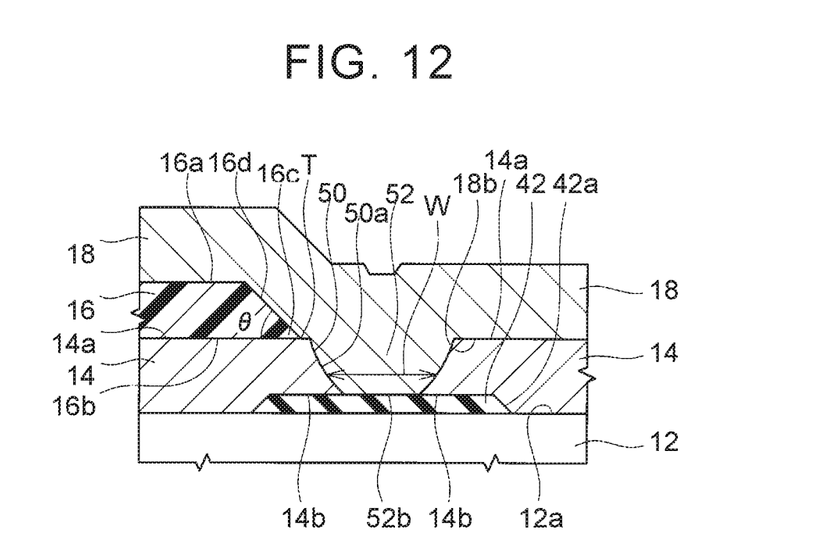
FIG. 12 illustrates an alteration of the semiconductor device 10 in which a side face 50a of a groove portion 50 of a first electrode layer 14 is curved concavely.

As illustrated in FIG. 12, as an alteration of the semiconductor device 10, a side face 50a of a groove portion 50 of a first electrode layer 14 may be curved concavely. Such groove portion 50 can be formed by means of, for example, wet etching. Here, a width W of the groove portion 50 is larger the closer to an upper face 14a of the first electrode layer 14, and consequently, effects that are similar to those of the alteration described with reference to FIGS. 10 and 11 can be exerted.

Figure 13:
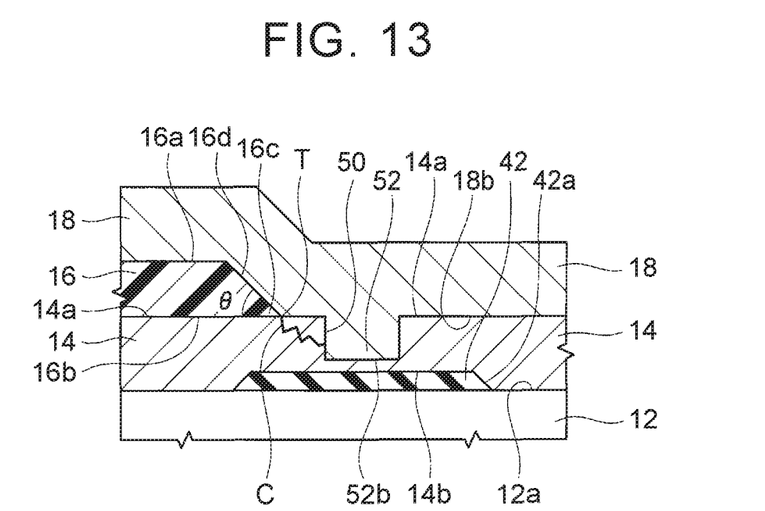
FIG. 13 illustrates an alteration of the semiconductor device 10 in which a groove portion 50 of a first electrode layer 14 is a bottomed groove.

As illustrated in FIG. 13, as an alteration of the semiconductor device 10, a groove portion 50 of a first electrode layer 14 may be a bottomed groove. In this case, a lower end 52b of a protrusion portion 52 of a second electrode layer 18 is positioned inside the first electrode layer 14. Then, the first electrode layer 14 is not completely divided by the protrusion portion 52 of the second electrode layer 18. As described above, a crack C generated in the first electrode layer 14 easily grows along the center position in a thickness direction of the first electrode layer 14. Therefore, such growth of a crack C can be suppressed by positioning the lower end 52b of the protrusion portion 52 of the second electrode layer 18 below the center position in the thickness direction of the first electrode layer 14.

Figure 14:
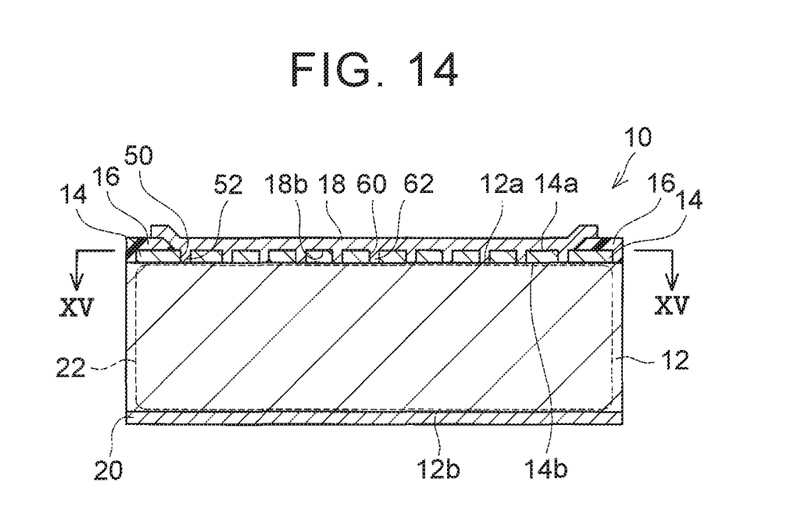
FIG. 14 illustrates an alteration of the semiconductor device 10 in which a plurality of second protrusion portions 62 are provided in a second electrode layer 18, in a section corresponding to FIG. 2.
Figure 15:
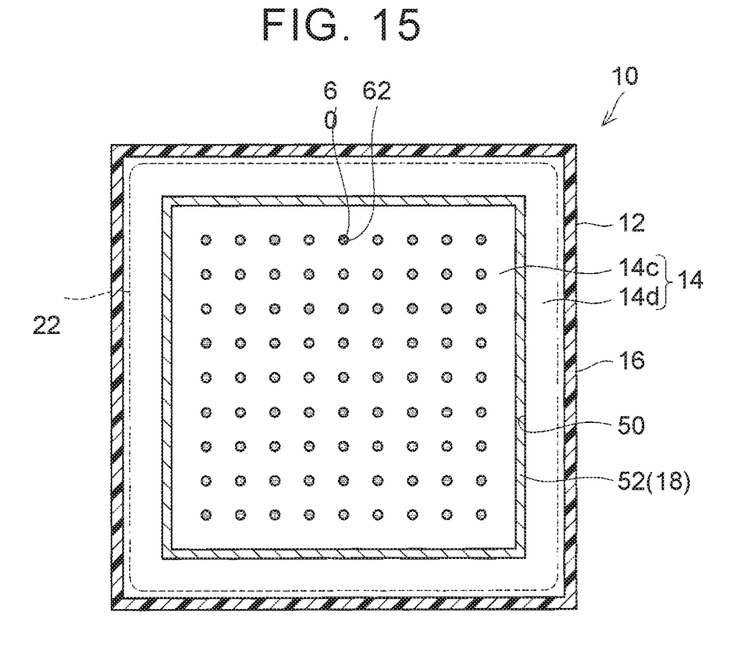
FIG. 15 is a sectional view along XV-XV in FIG. 14.

As illustrated in FIGS. 14 and 15, as an alteration of the semiconductor device 10, a group of through holes 60 may be provided in an upper face 14a of a first electrode layer 14, and a group of second protrusion portions 62 may be provided in a lower face 18b of a second electrode layer 18. The second protrusion portion 62 includes a material that is the same as that of the second electrode layer 18 and is formed integrally with the second electrode layer 18. Each through hole 60 extends to a lower face 14b of the first electrode layer 14, and each second protrusion portion 62 protrudes into a corresponding one of the plurality of through holes 60. With such configuration, the plurality of second protrusion portions 62 of the second electrode layer 18 are connected to an upper face 12a of the semiconductor substrate 12 with the first electrode layer 14 not interposed therebetween. Consequently, deformation and displacement of the semiconductor substrate 12 and the second electrode layer 18 relative to each other are suppressed, and thus stress acting on the first electrode layer 14 positioned between the semiconductor substrate 12 and the second electrode layer 18 can be reduced. Consequently, generation and growth of a crack C in the first electrode layer 14 can be suppressed. Here, the number and the positions of the through holes 60 (that is, the second protrusion portions 62) are not specifically limited and can be designed in various manners. Also, in the example illustrated in FIGS. 14 and 15, although the plurality of through holes 60 (and the plurality of second protrusion portions 62) are provided in an inner part 14c of the first electrode layer 14, a part or all of the plurality of through holes 60 (and the plurality of second protrusion portions 62) may be provided in an outer part 14d of the first electrode layer 14.

Figure 16:
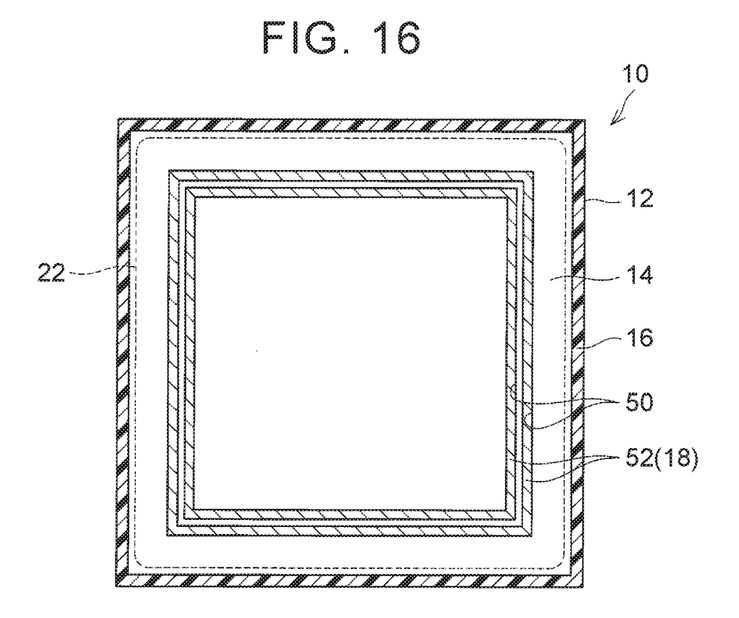
FIG. 16 illustrates an alteration of the semiconductor device 10 in which looped groove portions 50 are multiply provided in a first electrode layer 14.
Figure 17:
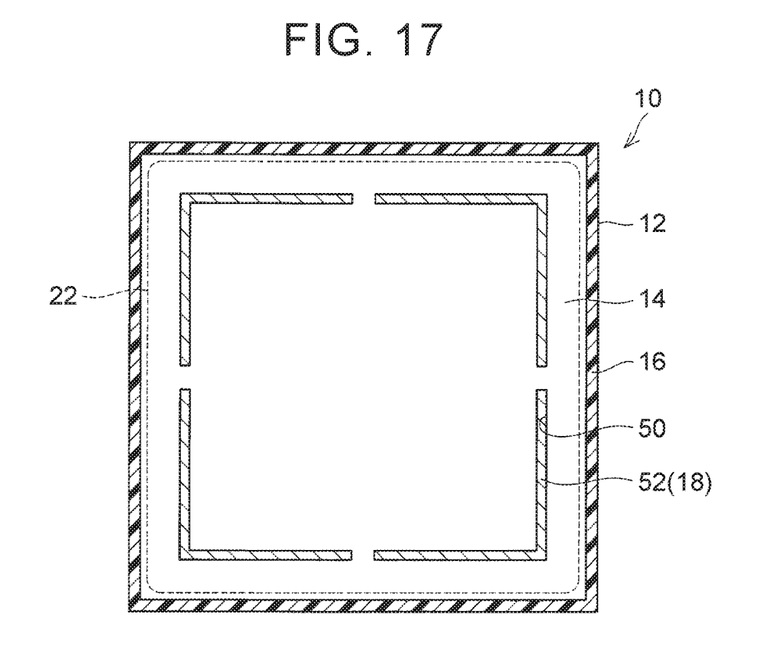
FIG. 17 illustrates an alteration of the semiconductor device 10 in which a groove portion 50 is provided discontinuously in the first electrode layer 14.

As illustrated in FIG. 16, as an alteration of the semiconductor device 10, in a first electrode layer 14, a plurality of groove portions 50 can multiply be provided. Such configuration enables more liable suppression of growth of a crack C. Also, as illustrated in FIG. 17, as an alteration of the semiconductor device 10, a groove portion 50 of a first electrode layer 14 (that is, a protrusion portion 52 of a second electrode layer 18) is not necessarily required to be a looped groove and may be a discontinuously-extending one.

Figure 18:
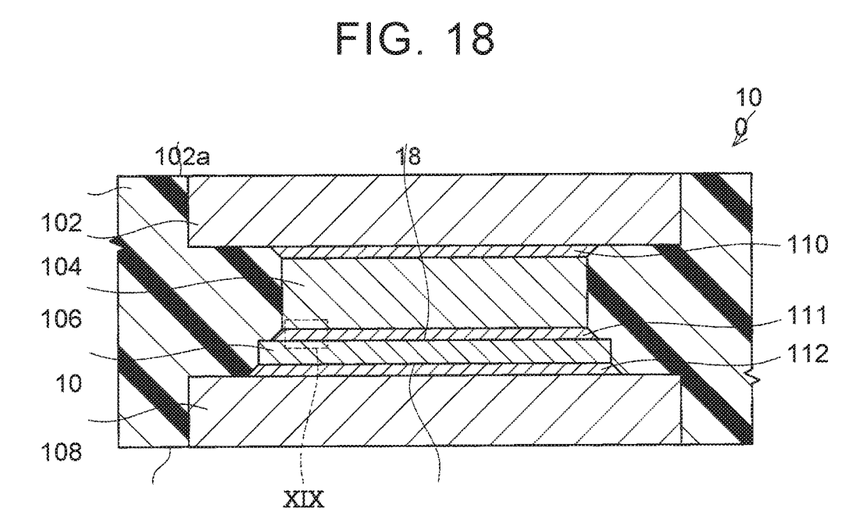
FIG. 18 is a sectional view schematically illustrating a structure of a semiconductor module 100.
Figure 19:
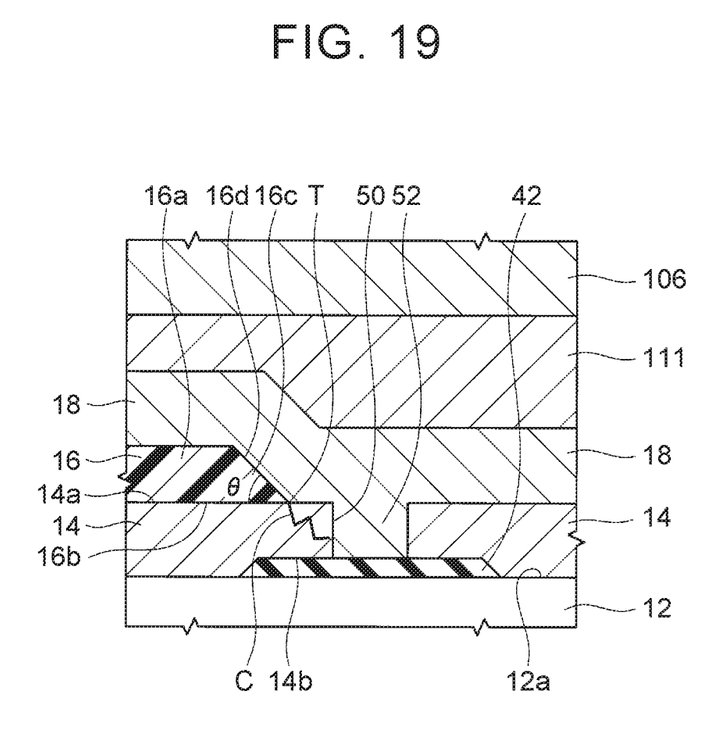
FIG. 19 is an enlarged view of part XIX in FIG. 18.

Next, a semiconductor module 100 using the semiconductor device 10 will be described with reference to FIGS. 18 and 19, as an example of use of the semiconductor device 10 (including the above-described alterations). The semiconductor module 100 includes the semiconductor device 10, and a resin mold 102 with the semiconductor device 10 encapsulated therein. The semiconductor module 100 further includes a first heatsink 104, a metal block 106 and a second heatsink 108. The first heatsink 104, the metal block 106 and the second heatsink 108 each include a metal material, and as an example, can be formed by copper.

The first heatsink 104 is joined to the upper face side (that is, the second electrode layer 18) of the semiconductor device 10 via the metal block 106. The first heatsink 104 and the metal block 106 are joined by solder 110, and the metal block 106 and the second electrode layer 18 are joined by solder 111. The second heatsink 108 is joined to the lower face side (that is, the lower face electrode layer 20) of the semiconductor device 10. The lower face electrode layer 20 and the second heatsink 108 are joined by solder 112. Although the illustration is omitted, a lead (or a bus bar) extending to the outside of the resin mold 102 is connected to each of the first heatsink 104 and the second heatsink 108. Consequently, the first heatsink 104, the metal block 106 and the second heatsink 108 form at least a part of a conductive path electrically connecting the semiconductor device 10 to an external device.

The first heatsink 104 is exposed at an upper face 102a of the resin mold 102, and the second heatsink 108 is exposed at a lower face 102b of the resin mold 102. With such configuration, heat generated in the semiconductor device 10 during operation is transmitted to the first heatsink 104 via the metal block 106 or is transmitted to the second heatsink 108, and released to the outside of the semiconductor module 100. In other words, the semiconductor module 100 has a double-sided cooling-type module structure. Ordinarily, the semiconductor module 100 is disposed in such a manner that each of the upper face 102a and the lower face 102b of the resin mold 102 is in contact with a cooler.

In the semiconductor module 100 having the above-described structure, during operation of the semiconductor device 10, the metal block 106, etc., also thermally expand. As described above, the metal block 106 is joined to the second electrode layer 18 via the solder 111. Therefore, the thermal expansion of the metal block 106 may cause stress on, e.g., the solder 111, the second electrode layer 18 and the first electrode layer 14. Here, it is assumed that the metal material included in the first electrode layer 14 (for example, aluminum) has a mechanical strength that is lower than that of the solder 111. Furthermore, it is assumed that the metal material included in the first electrode layer 14 has a mechanical strength that is lower than that of the metal material included in the second electrode layer 18 (for example, nickel). In this case, the thermal expansion of the metal block 106 causes large distortion particularly in the first electrode layer 14, which may result in generation of a crack C in the first electrode layer 14 as the boundary T as a starting point. As described above, in the semiconductor device 10, a crack C may be generated in the first electrode layer 14 not only by thermal expansion of the components of the semiconductor device 10, but also by thermal expansion of the metal block 106 and other external members directly or indirectly joined to the semiconductor device 10. However, even if such crack C is generated, growth of the crack C is physically suppressed by the protrusion portion 52 of the second electrode layer 18, enabling the crack C to be avoided from growing large.

Although several specific examples have been described in detail above, these examples are mere exemplary ones and are not intended to limit the scope of the claims. The technique described in the claims includes various alternations and modifications of the specific examples indicated above. The technical elements described in the present description or the drawings exert technical utility individually or in various combinations, and the combination of the technical elements is not limited to that stated in the claims as filed. Also, the technique indicated in the present description or the drawings can achieve a plurality of objectives at once, and achievement of one of the objectives itself indicates technical utility of the technique.

Technical matters that can be understood from the disclosure of the present description are indicated below. The technical matters described below are independent from one another, and exert technical utility individually or in various combinations.

In some embodiments, a semiconductor device includes: a semiconductor substrate with a semiconductor element formed therein; a first electrode layer provided on the semiconductor substrate and electrically connected to the semiconductor element; a protective insulation film stacked on a part of an upper face of the first electrode layer; and a second electrode layer stacked over both the first electrode layer and the protective insulation film, the second electrode layer including a material having a mechanical strength that is higher than a mechanical strength of a material included in the first electrode layer. In this case, a groove portion is provided in the upper face of the first electrode layer and a protrusion portion protruding into the groove portion be provided on a lower face of the second electrode layer. Then, a lower end of the protrusion portion is positioned below the center position in a thickness direction of the first electrode layer. With such configuration, even if a crack is generated in the first electrode layer, the crack can be prevented from growing large.

In some embodiments of the semiconductor device, the groove portion extends in a looped shape in the upper face of the first electrode layer. In this case, an inner part of the first electrode layer, the inner part is positioned on an inner side of the groove portion extending in a looped shape, is not in contact with the protective insulation film and is positioned on an element region of the semiconductor substrate. As described above, a crack may be generated with a boundary among the first electrode layer, the protective insulation film and the second electrode layer as a starting point. Regarding this point, the inner part of the first electrode layer is not in contact with the protective insulation film. Therefore, in the first electrode layer, a crack can be generated not in the inner part positioned on the inner side of the looped groove portion, but in the outer part positioned on the outer side of the looped groove portion. The inner part of the first electrode layer is separated from the outer part of the first electrode layer by the groove portion and the protrusion portion of the second electrode layer. Therefore, even if a crack is generated in the outer part of the first electrode layer, the crack is prevented from growing up to the inner part of the first electrode layer. Here, if at least a part of the inner part of the first electrode layer is positioned on the element region of the semiconductor substrate, functions of the semiconductor device can be maintained by the inner part of the first electrode layer.

In some embodiments of the semiconductor device, the groove portion extends to the lower face of the first electrode layer. With such configuration, a crack generated in the first electrode layer can be more reliably prevented from growing beyond the position of the groove portion of the first electrode layer (that is, the protrusion portion of the second electrode layer). Also, where the groove portion extends to the lower face of the first electrode layer, the lower end of the protrusion portion of the second electrode layer is connected to an upper face of the semiconductor substrate with the first electrode layer not interposed therebetween. Such configuration can suppress deformation and displacement of the semiconductor substrate and the second electrode layer relative to each other and thus can reduce stress acting on the first electrode layer positioned between the semiconductor substrate and the second electrode layer. Consequently, generation and growth of a crack C in the first electrode layer can be suppressed.

In some embodiments of the semiconductor device, a width of the groove portion increases the closer to the upper face of the first electrode layer. With such configuration, in a process of manufacturing the semiconductor device, in stacking of the second electrode layer on the first electrode layer with the groove portion formed therein, the inside of the groove portion can easily be filled by the material of the second electrode layer. Also, the area of contact between the first electrode layer and the second electrode layer in the groove portion can be increased. Furthermore, a side face of the groove portion is inclined, and thus, if a crack grows up to the groove portion, an angle formed by the crack and a surface of the protrusion portion of the second electrode layer is relatively small. Consequently, stress acting on the protrusion portion of the second electrode layer at a point the crack reaches decreases, enabling decrease in the risk of the crack running up to the protrusion portion.

In some embodiments of the semiconductor device, a group of through holes extending to the lower face of the first electrode layer are provided in the upper face of the first electrode layer and a group of second protrusion portions protruding into the group of the through holes be provided in the lower face of the second electrode layer. With such configuration, the group of second protrusion portions provided in the second electrode layer is connected to the upper face of the semiconductor substrate with the first electrode layer not interposed therebetween. Consequently, deformation and displacement of the semiconductor substrate and the second electrode layer relative to each other can be suppressed, and thus stress acting on the first electrode layer positioned between the semiconductor substrate and the second electrode layer can be reduced. Consequently, generation and growth of a crack in the first electrode layer can be suppressed.

In some embodiments of the semiconductor device, a linear expansion coefficient of the material included in the second electrode layer is closer to a linear expansion coefficient of a material included in the semiconductor substrate than a linear expansion coefficient of the material included in the first electrode layer. Such configuration can, for example, when the semiconductor device generates heat, reduce a difference between thermal expansion of the second electrode layer positioned on the upper face side of the first electrode layer and thermal expansion of the semiconductor substrate positioned on the lower face side of the first electrode layer. As a result, stress (in particular, shear stress) generated in the first electrode layer is reduced, enabling suppression of generation and growth of a crack in the first electrode layer.

Here, "mechanical strength" in the present description means a resistance of the material to destruction, that is, a destruction resistance to an external force, for example, a tensile force or a shear force. The mechanical strength can be determined by various types of indexes: in the present description, in particular, a focus is put on tensile strength and fatigue strength. In other words, high mechanical strength means at least good tensile strength, or both good tensile strength and good fatigue strength.

What is claimed is:
1. A semiconductor device comprising:
  a semiconductor substrate which a semiconductor element is formed;
  a first electrode layer stacked on the semiconductor substrate and electrically connected to the semiconductor element;
  a first insulation film stacked on a part of an upper face of the first electrode layer; and
  a second electrode layer stacked over both the first electrode layer and the first insulation film, the second electrode layer including a material having a mechanical strength that is higher than a mechanical strength of a material included in the first electrode layer; wherein
  a groove portion is provided from the upper face in a direction toward a lower face of the first electrode layer,
  a protrusion portion protruding into the groove portion is provided on a lower face of the second electrode layer, and
  a lower end of the protrusion portion is positioned below a center position in a thickness direction of the first electrode layer, and the lower end of the protrusion portion is positioned above or equal to the lower face of the first electrode layer.

2. The semiconductor device according to claim 1, wherein
  the groove portion extends in a looped shape in the upper face of the first electrode layer,
  an inner part of the first electrode layer is not in contact with the first insulation film and is positioned on an element region of the semiconductor substrate, the inner part being positioned on an inner side of the groove portion extending in the looped shape.

3. The semiconductor device according to claim 1, wherein
  the groove portion extends to the lower face of the first electrode layer.

4. The semiconductor device according to claim 1, wherein
  a width of the groove portion increases as closer to the upper face of the first electrode layer.

5. The semiconductor device according to claim 1, wherein
  a group of through holes extending to the lower face of the first electrode layer is provided in the upper face of the first electrode layer, and
  a group of second protrusion portions protruding into the group of through holes is provided in the lower face of the second electrode layer.

6. The semiconductor device according to claim 1, wherein
  a linear expansion coefficient of the material included in the second electrode layer is closer to a linear expansion coefficient of a material included in the semiconductor substrate than a linear expansion coefficient of the material included in the first electrode layer.

7. The semiconductor device according to claim 1, further comprising
a second insulating film provided between the semiconductor substrate and the first electrode layer, the second insulating film including a contact hole extending from an upper face to a lower face; and
an embedded electrode provided in the contact hole.

8. A semiconductor device comprising:
a semiconductor substrate which a semiconductor element is formed;
a first electrode layer stacked on the semiconductor substrate and electrically connected to the semiconductor element;
a first insulation film stacked on a part of an upper face of the first electrode layer; and
a second electrode layer stacked over both the first electrode layer and the first insulation film, the second electrode layer including a material having a mechanical strength that is higher than a mechanical strength of a material included in the first electrode layer;
wherein
a groove portion is provided from the upper face in a direction toward a lower face of the first electrode layer,
a protrusion portion protruding into the groove portion is provided on a lower face of the second electrode layer, and
a lower end of the protrusion portion is positioned below a center position in a thickness direction of the first electrode layer,
the groove portion extends in a looped shape in the upper face of the first electrode layer, and
an inner part of the first electrode layer is not in contact with the first insulation film and is positioned on an element region of the semiconductor substrate, the inner part being positioned on an inner side of the groove portion extending in the looped shape.

9. A semiconductor device comprising:
a semiconductor substrate which a semiconductor element is formed;
a first electrode layer stacked on the semiconductor substrate and electrically connected to the semiconductor element;
a first insulation film stacked on a part of an upper face of the first electrode layer;
a second insulating film provided between the semiconductor substrate and the first electrode layer, the second insulating film including a contact hole extending from an upper face to a lower face;
an embedded electrode provided in the contact hole; and
a second electrode layer stacked over both the first electrode layer and the first insulation film, the second electrode layer including a material having a mechanical strength that is higher than a mechanical strength of a material included in the first electrode layer;
wherein
a groove portion is provided from the upper face in a direction toward a lower face of the first electrode layer,
a protrusion portion protruding into the groove portion is provided on a lower face of the second electrode layer, and
a lower end of the protrusion portion is positioned below a center position in a thickness direction of the first electrode layer.

* * * * *

UNITED STATES PATENT AND TRADEMARK OFFICE
CERTIFICATE OF CORRECTION

| | |
|---|---|
| PATENT NO. | : 10,128,196 B2 |
| APPLICATION NO. | : 15/248701 |
| DATED | : November 13, 2018 |
| INVENTOR(S) | : Takashi Ushijima |

It is certified that error appears in the above-identified patent and that said Letters Patent is hereby corrected as shown below:

Drawing Sheet 1, Figure 2, replace with the attached replacement drawing sheet.
    Drawing Sheet 2, Figure 3, replace with the attached replacement drawing sheet.
    Drawing Sheet 2, Figure 4, replace with the attached replacement drawing sheet.
    Drawing Sheet 4, Figure 7, replace with the attached replacement drawing sheet.
    Drawing Sheet 4, Figure 8, replace with the attached replacement drawing sheet.
    Drawing Sheet 5, Figure 9, replace with the attached replacement drawing sheet.
    Drawing Sheet 5, Figure 10, replace with the attached replacement drawing sheet.
    Drawing Sheet 6, Figure 11, replace with the attached replacement drawing sheet.
    Drawing Sheet 6, Figure 12, replace with the attached replacement drawing sheet.
    Drawing Sheet 8, Figure 15, replace with the attached replacement drawing sheet.
    Drawing Sheet 9, Figure 18, replace with the attached replacement drawing sheet.

Signed and Sealed this
Twenty-sixth Day of March, 2019

Andrei Iancu
*Director of the United States Patent and Trademark Office*

FIG. 1
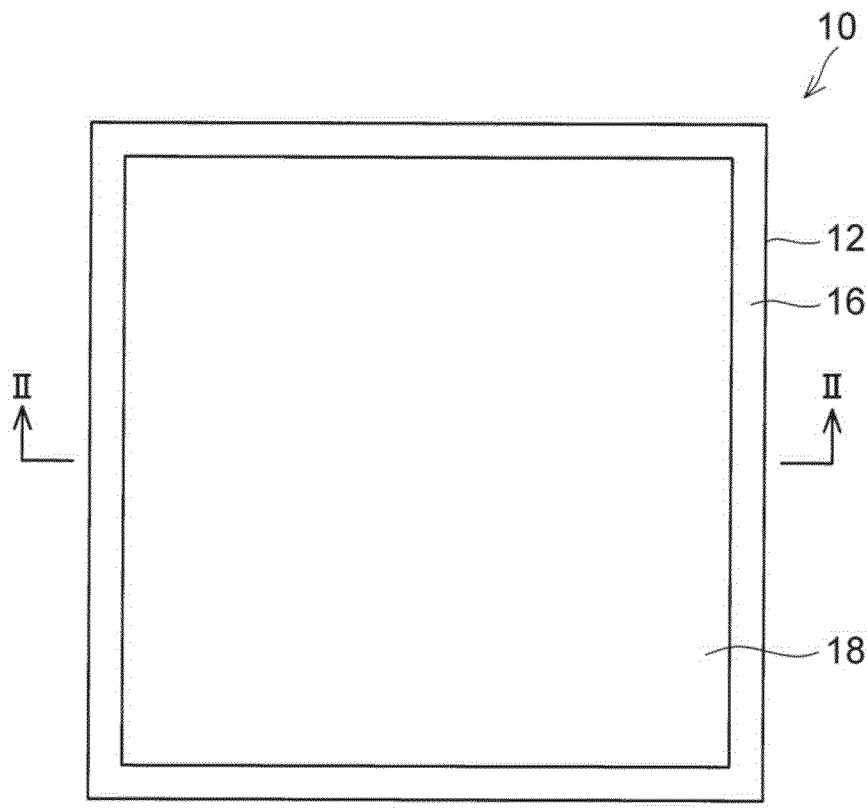
FIG. 2
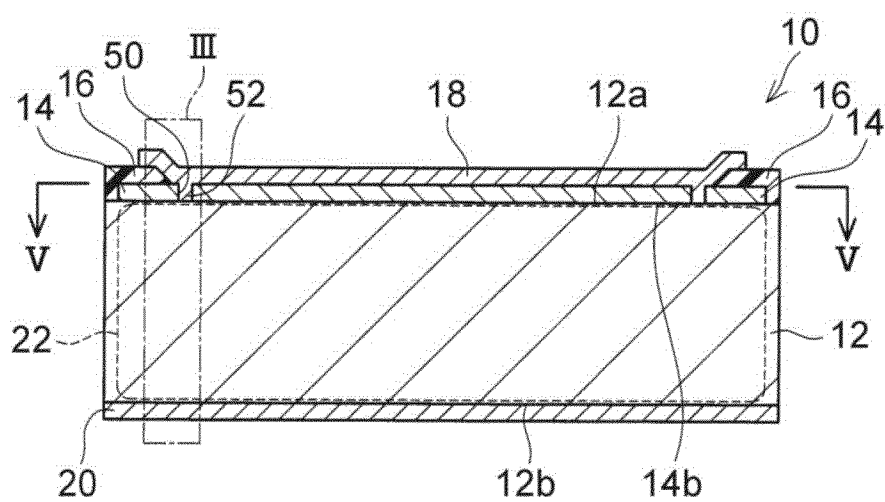

FIG. 7
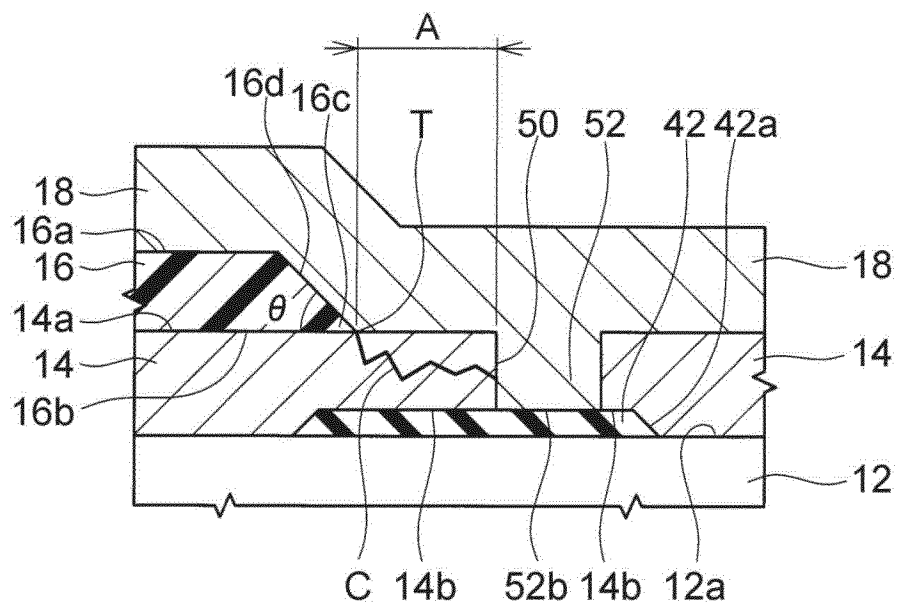
FIG. 8
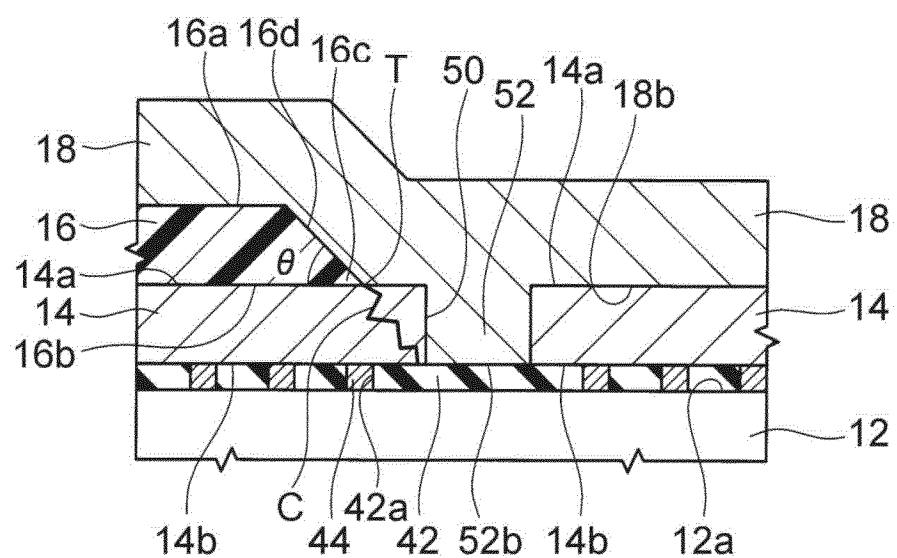

FIG. 9
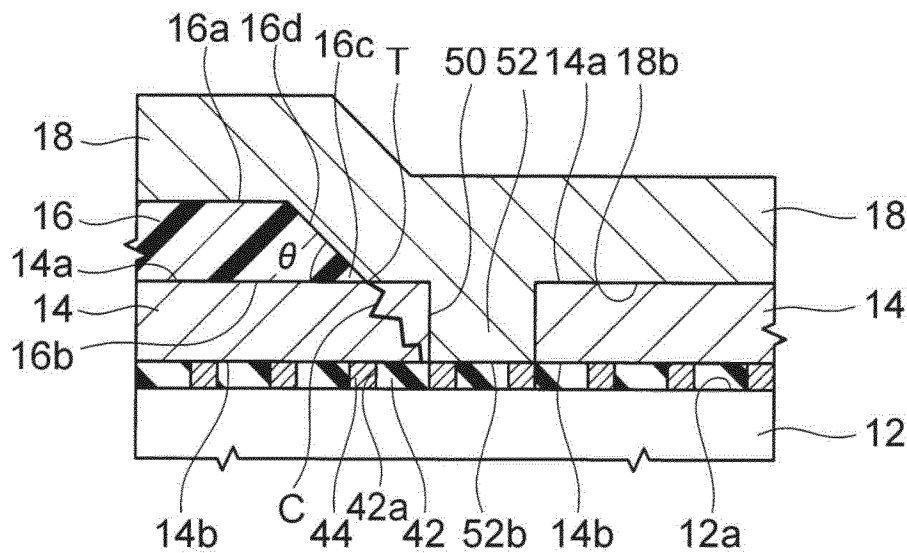
FIG. 10
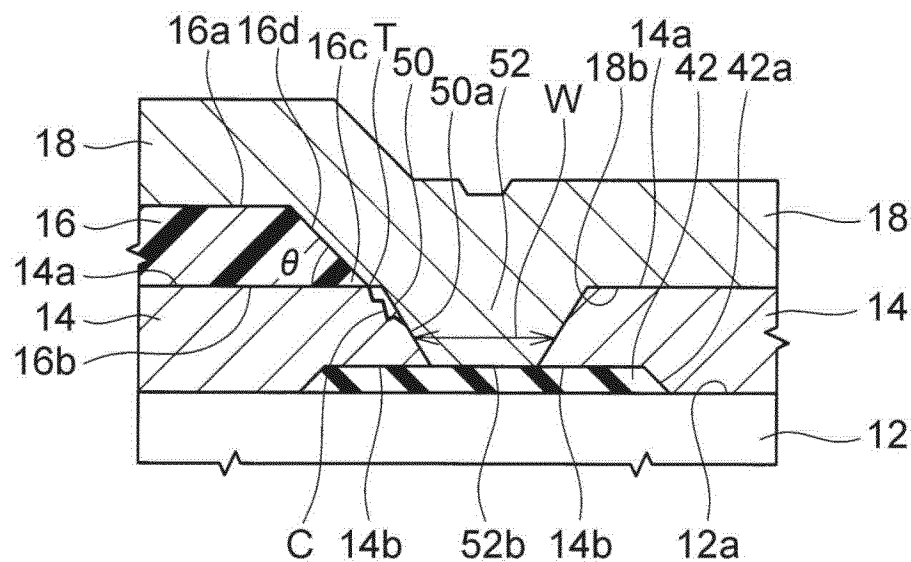

FIG. 11
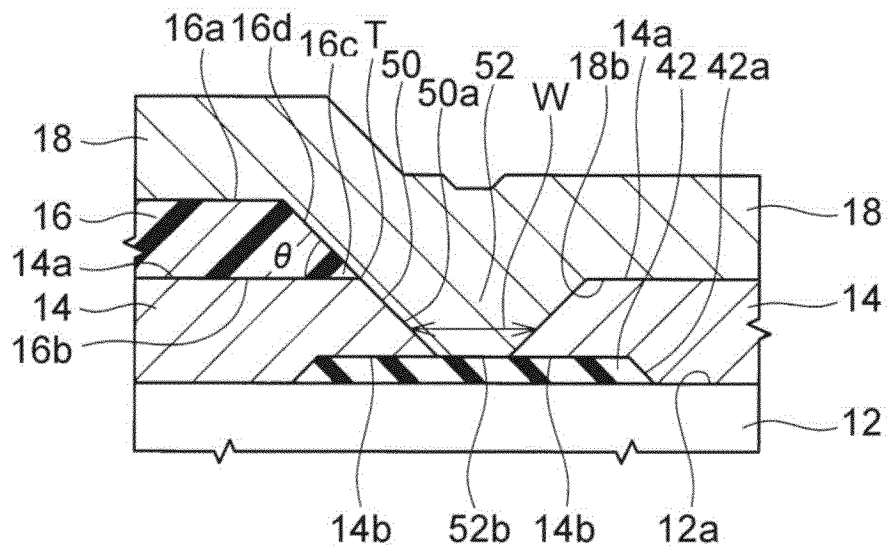
FIG. 12
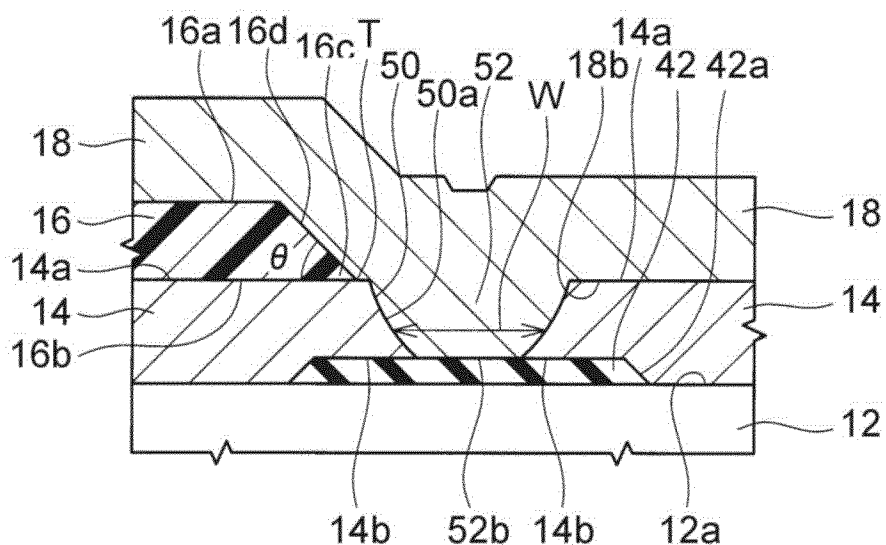

FIG. 15
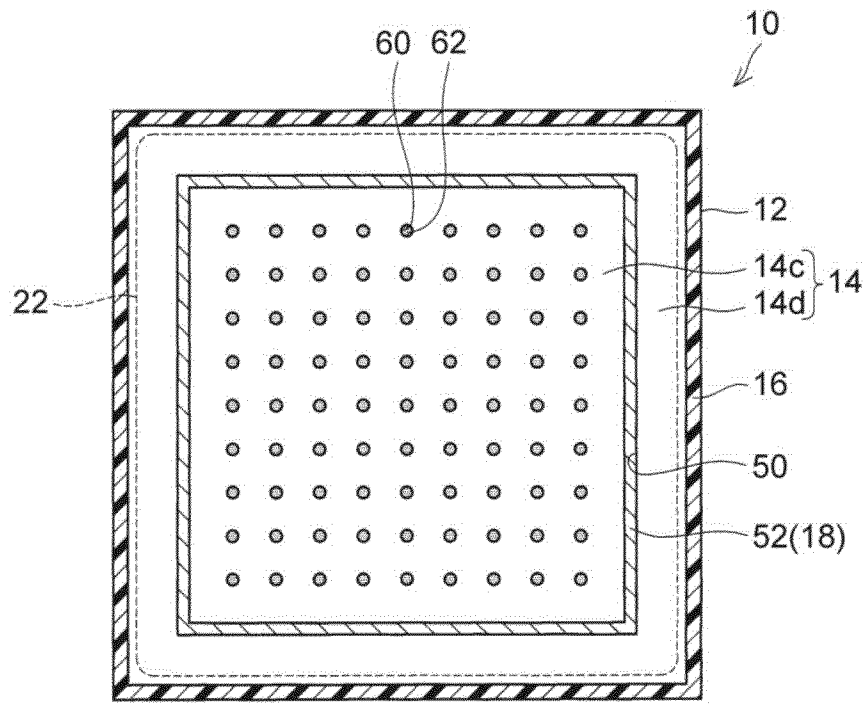
FIG. 16
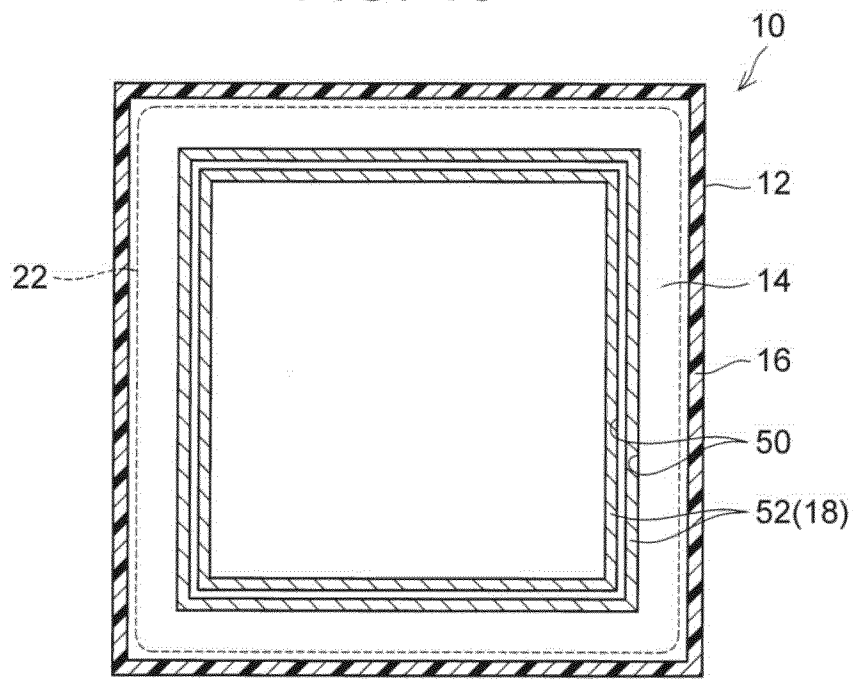

FIG. 17
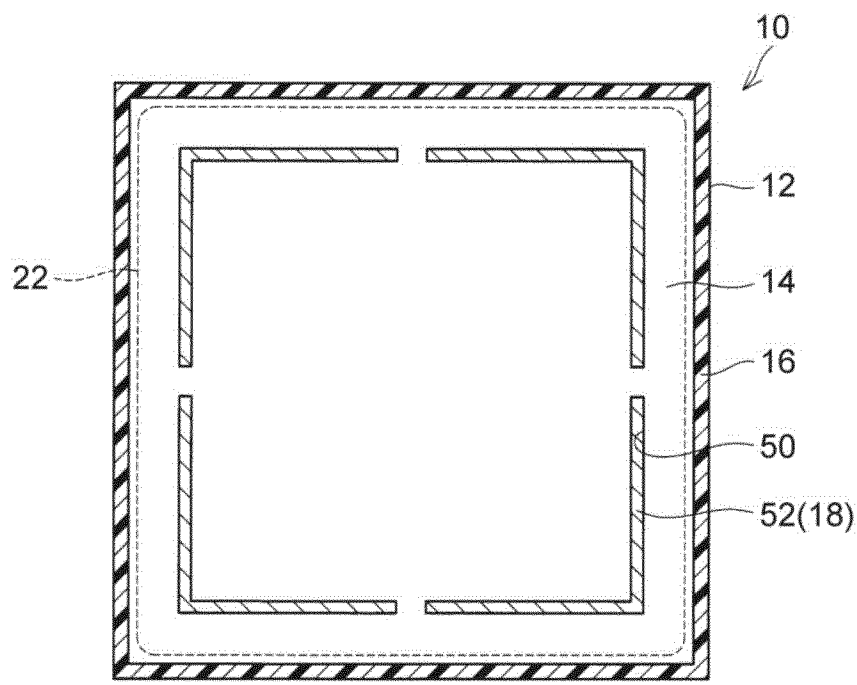
FIG. 18
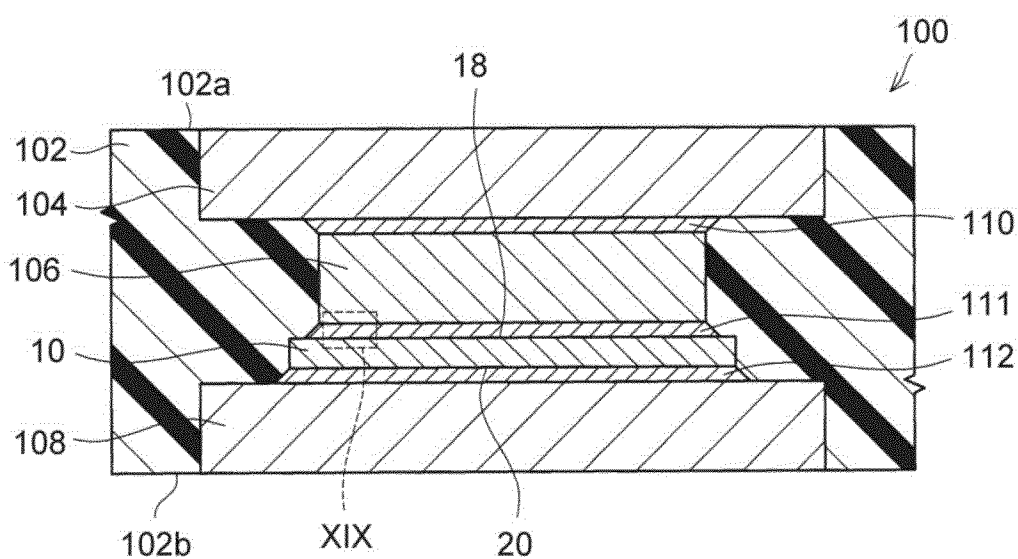

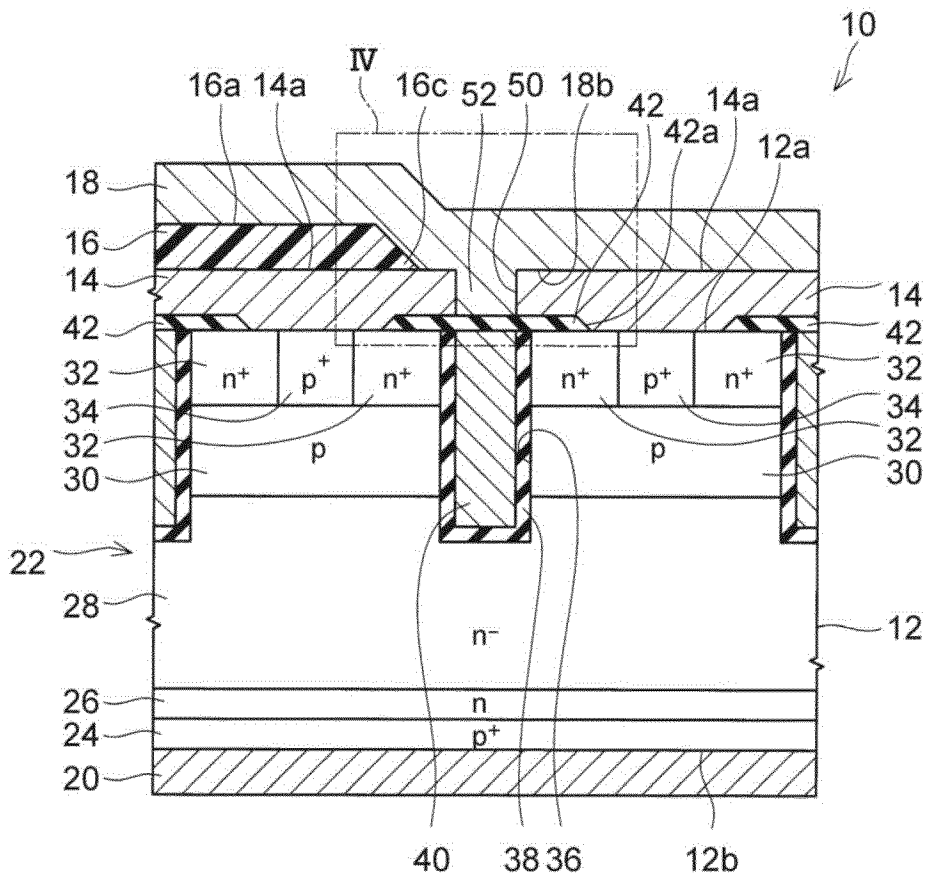
FIG. 3
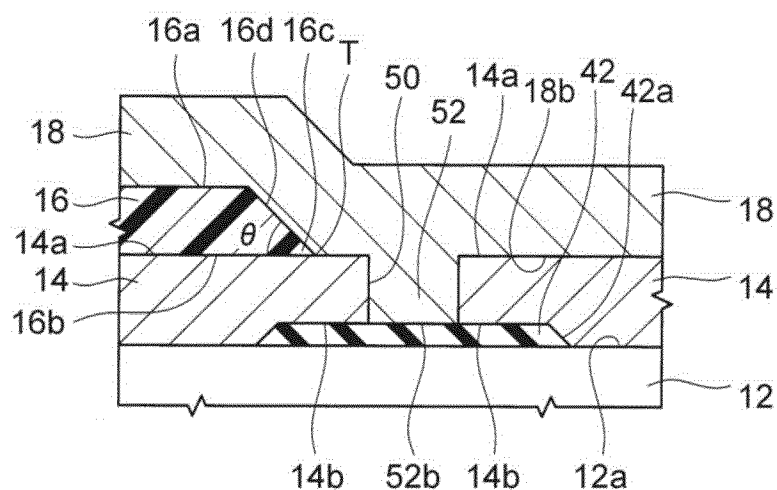
FIG. 4